United States Patent
Wu et al.

(10) Patent No.: US 9,892,962 B2
(45) Date of Patent: Feb. 13, 2018

(54) WAFER LEVEL CHIP SCALE PACKAGE INTERCONNECTS AND METHODS OF MANUFACTURE THEREOF

(71) Applicant: Taiwan Semiconductor Manufacturing Company, Ltd., Hsin-Chu (TW)

(72) Inventors: Cheng-Tar Wu, Jhongli (TW);
Chung-Shi Liu, Hsin-Chu (TW);
Chih-Wei Lin, Hsin-Chu (TW);
Hui-Min Huang, Hsin-Chu (TW);
Chun-Cheng Lin, New Taipei (TW);
Ming-Da Cheng, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/953,783

(22) Filed: Nov. 30, 2015

(65) Prior Publication Data
US 2017/0154811 A1 Jun. 1, 2017

(51) Int. Cl.
*H01L 21/768* (2006.01)
*H01L 23/532* (2006.01)
*H01L 23/00* (2006.01)

(52) U.S. Cl.
CPC .. *H01L 21/76834* (2013.01); *H01L 21/76828* (2013.01); *H01L 23/5329* (2013.01); *H01L 24/14* (2013.01); *H01L 2224/10125* (2013.01)

(58) Field of Classification Search
CPC ............... H01L 23/295; H01L 257/795; H01L 257/787; H01L 257/788; H01L 257/789; H01L 33/56; H01L 257/777; H01L 257/778; H01L 257/78; H01L 257/781; H01L 25/043; H01L 25/0657; H01L 25/0756; H01L 25/117; H01L 2225/06513; H01L 2225/06517; H01L 2924/00014; H01L 2924/181; H01L 21/565; H01L 2224/94; H01L 23/3107; H01L 23/481; H01L 24/14; H01L 24/11; H05K 2201/10515
See application file for complete search history.

(56) References Cited

U.S. PATENT DOCUMENTS

| | | |
|---|---|---|
| 5,072,520 A | 12/1991 | Nelson |
| 5,317,801 A | 6/1994 | Tanaka et al. |
| 5,869,904 A | 2/1999 | Shoji |
| 6,037,065 A | 3/2000 | Hajmrle et al. |
| 6,158,644 A | 12/2000 | Brofman et al. |
| 6,187,615 B1 | 2/2001 | Kim et al. |
| 6,365,978 B1 | 4/2002 | Ibnabdeljalil et al. |

(Continued)

FOREIGN PATENT DOCUMENTS

| | | |
|---|---|---|
| CN | 101002318 A | 7/2007 |
| CN | 102097397 A | 6/2011 |

(Continued)

*Primary Examiner* — Sonya D McCall Shepard
(74) *Attorney, Agent, or Firm* — Slater Matsil, LLP

(57) ABSTRACT

A method of forming a wafer level chip scale package interconnect may include: forming a post-passivation interconnect (PPI) layer over a substrate; forming an interconnect over the PPI layer; and releasing a molding compound material over the substrate, the molding compound material flowing to laterally encapsulate a portion of the interconnect.

20 Claims, 4 Drawing Sheets

(56) References Cited

U.S. PATENT DOCUMENTS

| | | | |
|---|---|---|---|
| 6,369,451 B2 | 4/2002 | Lin | |
| 6,425,516 B1 | 7/2002 | Iwatsu et al. | |
| 6,586,322 B1 | 7/2003 | Chiu et al. | |
| 6,643,923 B1 | 11/2003 | Hishinuma et al. | |
| 6,664,637 B2 | 12/2003 | Jimarez et al. | |
| 6,933,613 B2 | 8/2005 | Akashi | |
| 6,940,169 B2 | 9/2005 | Jin et al. | |
| 7,187,068 B2 | 3/2007 | Suh et al. | |
| 7,253,078 B1* | 8/2007 | Nguyen | H01L 21/563 257/E21.503 |
| 7,372,151 B1 | 5/2008 | Fan et al. | |
| 7,749,882 B2 | 7/2010 | Kweon et al. | |
| 7,977,783 B1 | 7/2011 | Park et al. | |
| 8,264,089 B2 | 9/2012 | Alvarado et al. | |
| 8,294,279 B2* | 10/2012 | Chen | H01L 21/563 257/686 |
| 8,345,435 B2 | 1/2013 | Hamatani et al. | |
| 8,361,842 B2 | 1/2013 | Yu et al. | |
| 8,362,612 B1 | 1/2013 | Paek et al. | |
| 8,624,392 B2 | 1/2014 | Yew et al. | |
| 8,680,647 B2 | 3/2014 | Yu et al. | |
| 8,703,542 B2 | 4/2014 | Lin et al. | |
| 8,735,273 B2 | 5/2014 | Lu et al. | |
| 8,759,964 B2 | 6/2014 | Pu et al. | |
| 8,778,738 B1 | 7/2014 | Lin et al. | |
| 8,785,299 B2 | 7/2014 | Mao et al. | |
| 8,803,306 B1 | 8/2014 | Yu et al. | |
| 8,809,996 B2 | 8/2014 | Chen et al. | |
| 8,829,676 B2 | 9/2014 | Yu et al. | |
| 8,877,554 B2 | 11/2014 | Tsai et al. | |
| 9,209,140 B2* | 12/2015 | Chen | H01L 23/49811 |
| 9,257,333 B2 | 2/2016 | Lu et al. | |
| 9,263,839 B2 | 2/2016 | Chen et al. | |
| 9,437,564 B2 | 9/2016 | Lu et al. | |
| 2001/0050434 A1 | 12/2001 | Kaneda et al. | |
| 2002/0001937 A1 | 1/2002 | Kikuchi et al. | |
| 2002/0031868 A1 | 3/2002 | Capote et al. | |
| 2002/0167077 A1 | 11/2002 | Vincent | |
| 2003/0068847 A1 | 4/2003 | Watanabe et al. | |
| 2003/0096453 A1 | 5/2003 | Wang et al. | |
| 2003/0153172 A1 | 8/2003 | Yajima et al. | |
| 2004/0012930 A1 | 1/2004 | Grigg | |
| 2004/0027788 A1 | 2/2004 | Chiu et al. | |
| 2004/0072387 A1 | 4/2004 | Hong et al. | |
| 2004/0118599 A1 | 6/2004 | Chason et al. | |
| 2004/0188131 A1 | 9/2004 | Dunlap | |
| 2004/0251561 A1 | 12/2004 | Wilson et al. | |
| 2004/0266162 A1 | 12/2004 | Feng | |
| 2005/0006766 A1 | 1/2005 | Nakayoshi et al. | |
| 2005/0080956 A1 | 4/2005 | Laudtke et al. | |
| 2005/0287699 A1 | 12/2005 | Brauer | |
| 2006/0038291 A1 | 2/2006 | Chung et al. | |
| 2006/0063378 A1 | 3/2006 | Lin et al. | |
| 2006/0189114 A1 | 8/2006 | Seto et al. | |
| 2007/0045840 A1 | 3/2007 | Varnau | |
| 2007/0102815 A1 | 5/2007 | Kaufmann et al. | |
| 2007/0108573 A1 | 5/2007 | Chung et al. | |
| 2007/0176290 A1 | 8/2007 | Park et al. | |
| 2007/0184577 A1 | 8/2007 | Chung et al. | |
| 2007/0187825 A1 | 8/2007 | Hashimoto | |
| 2007/0267745 A1 | 11/2007 | Chao et al. | |
| 2008/0001290 A1 | 1/2008 | Chou et al. | |
| 2008/0044951 A1 | 2/2008 | Bang et al. | |
| 2008/0150134 A1 | 6/2008 | Shinkai et al. | |
| 2008/0308935 A1 | 12/2008 | Kim et al. | |
| 2009/0020864 A1 | 1/2009 | Pu et al. | |
| 2009/0045513 A1 | 2/2009 | Kim et al. | |
| 2009/0052218 A1 | 2/2009 | Kang | |
| 2009/0120215 A1 | 5/2009 | Jacobson et al. | |
| 2009/0130840 A1 | 5/2009 | Wang et al. | |
| 2009/0140442 A1 | 6/2009 | Lin | |
| 2009/0140942 A1 | 6/2009 | Mikkola et al. | |
| 2009/0146317 A1 | 6/2009 | Shih | |
| 2009/0206479 A1 | 8/2009 | Daubenspeck et al. | |
| 2009/0256268 A1 | 10/2009 | Ayotte et al. | |
| 2009/0314519 A1 | 12/2009 | Soto et al. | |
| 2010/0065966 A1 | 3/2010 | Pendse et al. | |
| 2010/0078772 A1 | 4/2010 | Robinson | |
| 2010/0096754 A1 | 4/2010 | Lee et al. | |
| 2010/0140760 A1 | 6/2010 | Tam et al. | |
| 2011/0037158 A1 | 2/2011 | Youn et al. | |
| 2011/0080713 A1 | 4/2011 | Sunohara | |
| 2011/0101520 A1 | 5/2011 | Liu et al. | |
| 2011/0108983 A1 | 5/2011 | Lu et al. | |
| 2011/0128711 A1 | 6/2011 | Yim et al. | |
| 2011/0157853 A1 | 6/2011 | Goh | |
| 2011/0278739 A1 | 11/2011 | Lai et al. | |
| 2011/0285008 A1 | 11/2011 | Nakano | |
| 2011/0291288 A1 | 12/2011 | Wu et al. | |
| 2012/0006592 A1 | 1/2012 | Ouchi et al. | |
| 2012/0199959 A1 | 8/2012 | Hart | |
| 2012/0199991 A1 | 8/2012 | Okamoto et al. | |
| 2012/0261817 A1 | 10/2012 | Do et al. | |
| 2013/0009307 A1 | 1/2013 | Lu et al. | |
| 2013/0026468 A1 | 1/2013 | Yoshimuta et al. | |
| 2013/0062760 A1 | 3/2013 | Hung et al. | |
| 2013/0062761 A1 | 3/2013 | Lin et al. | |
| 2013/0093084 A1 | 4/2013 | Chen et al. | |
| 2013/0105971 A1 | 5/2013 | Daubenspeck et al. | |
| 2013/0147031 A1 | 6/2013 | Chen et al. | |
| 2013/0168848 A1 | 7/2013 | Lin et al. | |
| 2013/0168850 A1 | 7/2013 | Samoilov et al. | |
| 2013/0181338 A1 | 7/2013 | Lu et al. | |
| 2013/0307140 A1 | 11/2013 | Huang et al. | |
| 2014/0054764 A1 | 2/2014 | Lu et al. | |
| 2014/0077361 A1 | 3/2014 | Lin et al. | |
| 2014/0159223 A1 | 6/2014 | Chen et al. | |
| 2014/0175639 A1 | 6/2014 | Kim et al. | |
| 2014/0187103 A1 | 7/2014 | Chen et al. | |
| 2014/0203429 A1 | 7/2014 | Yu et al. | |
| 2014/0225222 A1 | 8/2014 | Yu et al. | |
| 2014/0231125 A1 | 8/2014 | Chen et al. | |
| 2014/0232017 A1 | 8/2014 | Rampley et al. | |
| 2014/0252601 A1 | 9/2014 | Lu et al. | |
| 2014/0252646 A1 | 9/2014 | Hung et al. | |
| 2014/0256092 A1 | 9/2014 | Kuo et al. | |
| 2014/0264846 A1 | 9/2014 | Chen et al. | |
| 2014/0264930 A1 | 9/2014 | Yu et al. | |
| 2015/0014851 A1 | 1/2015 | Lu et al. | |
| 2015/0123269 A1 | 5/2015 | Chen et al. | |
| 2015/0137352 A1 | 5/2015 | Chen et al. | |
| 2015/0214145 A1 | 7/2015 | Lu et al. | |
| 2015/0235977 A1 | 8/2015 | Shao et al. | |
| 2015/0243613 A1 | 8/2015 | Chen et al. | |
| 2015/0249066 A1 | 9/2015 | Lin et al. | |
| 2015/0262948 A1 | 9/2015 | Lu et al. | |
| 2016/0133482 A1 | 5/2016 | Chen et al. | |
| 2016/0218090 A1 | 7/2016 | Yu et al. | |

FOREIGN PATENT DOCUMENTS

| | | |
|---|---|---|
| DE | 102005040213 A1 | 3/2006 |
| DE | 112005001949 T5 | 5/2007 |
| JP | 11255864 | 9/1999 |
| KR | 19990086280 | 12/1999 |
| KR | 20050084487 A | 8/2005 |
| KR | 100780956 B1 | 12/2007 |
| KR | 20090018442 A | 2/2009 |
| KR | 20090120215 A | 11/2009 |
| KR | 20100131180 A | 12/2010 |
| TW | 201246540 A | 11/2012 |

* cited by examiner

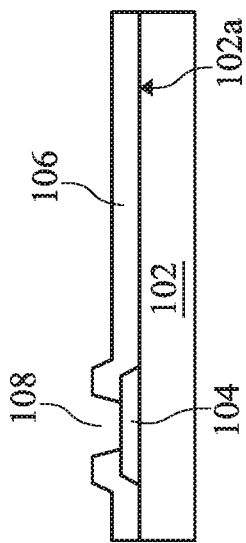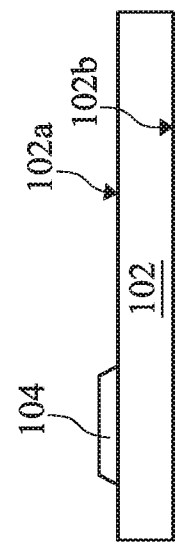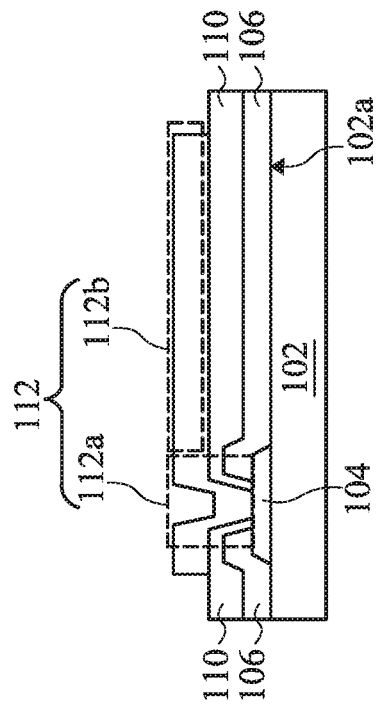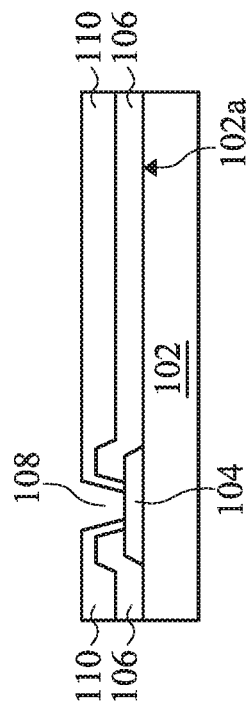
Fig. 1A
Fig. 1B
Fig. 1C
Fig. 1D

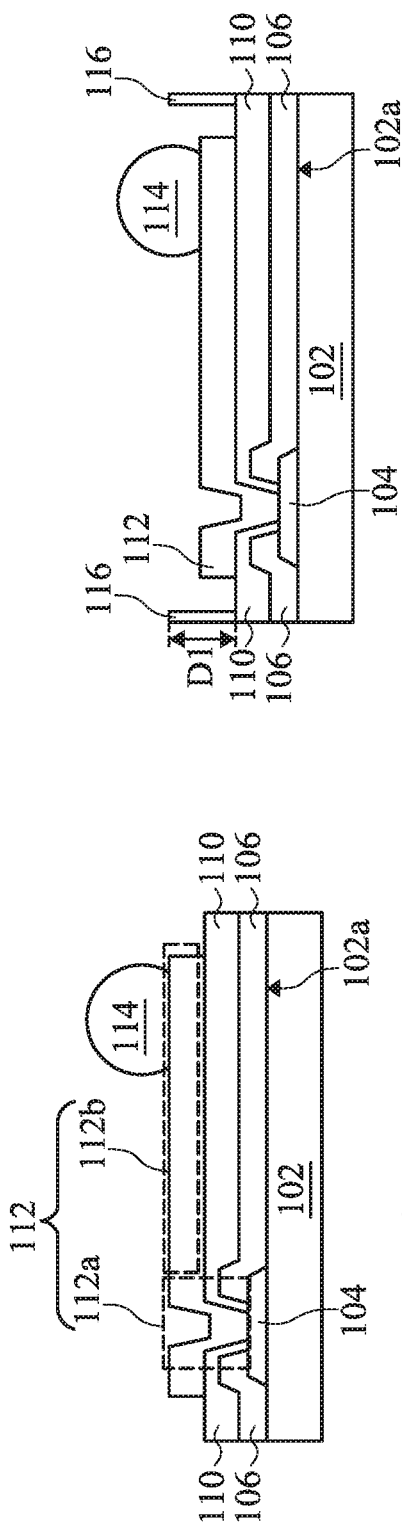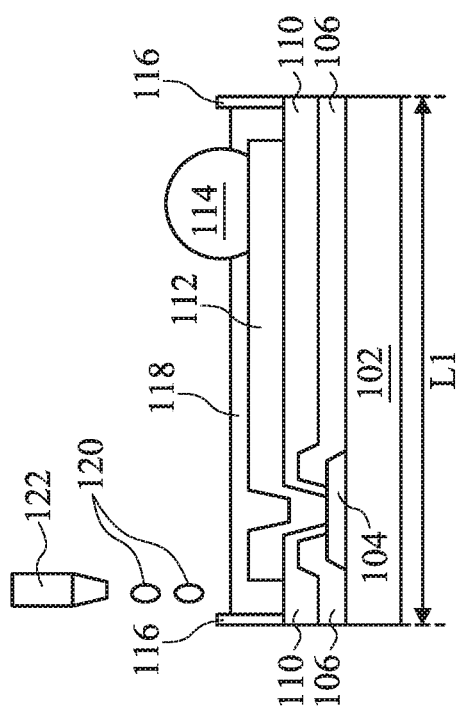

WAFER LEVEL CHIP SCALE PACKAGE INTERCONNECTS AND METHODS OF MANUFACTURE THEREOF

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductor layers of material over a semiconductor substrate, and patterning the various material layers using lithography to form circuit components and elements thereon.

Interconnects may be formed to join two substrates. An array of interconnects may be deposited on the bonding pads of a first substrate, with a second substrate joined at its own bonding pad sites to the first substrate via the interconnects. For example, interconnects may be solder balls formed on a pad and then reflowed to attach a second substrate. The interconnects may be formed with a layout different from the land layout to permit customization of the output layout. This may be accomplished with metal lines disposed in a dielectric, with one or more metal layers overlying the lands and connected to the lands by conductive plating layers.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A to 1G show a process flow illustrating some of the steps of a method for forming an interconnect, in accordance with some embodiments.

DETAILED DESCRIPTION

Figure 2:
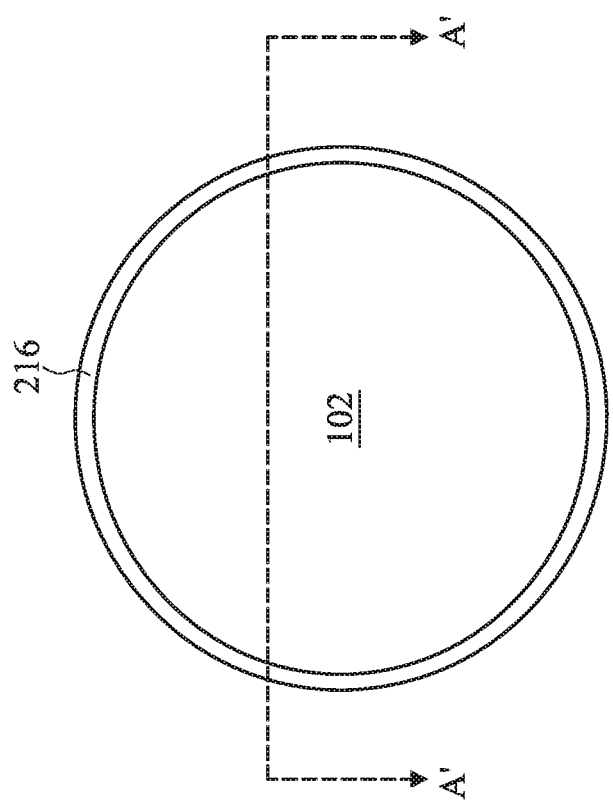
FIG. 2 shows a top-down view of a substrate and a dam ring formed along an edge of the substrate, in accordance with some embodiments.

The following disclosure provides many different embodiments, or examples, for implementing different features of the provided subject matter. Specific examples of components and stacks are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1A to 1G show a process flow illustrating some of the steps of a method for forming an interconnect, in accordance with an embodiment. FIG. 1A shows a substrate 102 having a first surface 102a and a second surface 102b opposite the first surface 102a. The substrate 102 may be wafer, a chip, a die, a package, or the like. As an example, the substrate 102 may be a wafer level chip scale package (WLCSP) structure. The substrate 102 may comprise a semiconductive material. As examples, the substrate 102 may comprise an elementary semiconductor (e.g. including silicon and/or germanium in crystal), a compound semiconductor (e.g. including at least one of silicon carbide, gallium arsenic, gallium phosphide, indium phosphide, indium arsenide, or indium antimonide), an alloy semiconductor (e.g. including at least one of SiGe, GaAsP, AlInAs, AlGaAs, GaInAs, GaInP, or GaInAsP), or combinations thereof.

The substrate 102 may have one or more devices (e.g. active and/or passive devices) formed therein or thereon. The one or more devices are not shown in FIG. 1A for the sake of simplicity. The one or more devices formed in or on the substrate 102 may be electrically connected to one or more contact pads 104 that may be disposed over the first surface 102a of the substrate 102. Only one contact pad 104 is shown as an example; however, more than one contact pad 104 may be disposed over the first surface 102a of the substrate 102. The one or more contact pads 104 may comprise a conductive material. As an example, the one or more contact pads 104 may comprise aluminum (Al), polysilicon, gold (Au), copper (Cu), tantalum (Ta), tungsten (W), silver (Ag), palladium (Pd), combinations thereof, or the like.

FIG. 1B shows a first insulating layer 106 formed over the substrate 102, e.g. to passivate the first surface 102a of the substrate 102. The first insulating layer 106 may have one or more openings 108 that may expose at least a portion of the one or more contact pads 104. In an embodiment, the first insulating layer 106 may be a substantially conformal layer. The first insulating layer 106 may be formed by chemical vapor deposition (CVD), physical vapor deposition (PVD), atomic layer deposition (ALD), a spin-on-dielectric process, combinations thereof, or the like. The one or more openings 108 may be formed by etching portions of the first insulating layer 106 disposed over the one or more contact pads 104, e.g. using a photolithographic etching process. The first insulating layer 104 may comprise a dielectric material. As an example, the first insulating layer 104 may comprise silicon oxide, silicon dioxide ($SiO_2$), silicon nitride (SiN), silicon carbide (SiC), titanium nitride (TiN), combinations thereof, or the like.

FIG. 1C shows a second insulating layer 110 formed over the first insulating layer 106. The second insulating layer 110 and the first insulating layer 106 may differ in composition. As an example, the second insulating layer 110 may comprise a polymer, examples of which include a polyimide, benzocyclobutene (BCB), polybenzoxazole (PBO), combinations thereof, or the like. In an embodiment, the second insulating layer 110 may be a substantially conformal layer. The second insulating layer 110 may be formed using similar process as described above in respect of the first insulating layer 106. In the example shown in FIG. 1C, the second insulating layer 110 may cover sidewalls of the one or more openings 108. However, in another example, the second insulating layer 110 may be disposed (e.g. fully disposed) outside the one or more openings 108 and over a surface of the first insulating layer 106 facing away from the substrate 102.

FIG. 1D shows a post-passivation interconnect (PPI) layer 112 formed over the one or more contact pads 104 and the second insulating layer 110. The PPI layer 112 may comprise a contact portion 112a disposed within the one or more openings 108 and an extension portion 112b disposed outside the one or more openings 108 and extending over the second insulating layer 110. The PPI layer 112 may be a conductive layer, such as a metal layer, formed to extend from the one or more contact pads 104 to a region over the second insulating layer 110. The PPI layer 112 may be formed by blanket deposition of a metal layer and subsequent masking and etching of the metal layer. The PPI layer 112 may also be formed by depositing a mask and then depositing a metal in the mask openings to form a PPI layer 112. The PPI layer 112 may be formed with a thickness between about 4 µm and about 10 µm. In an embodiment, the PPI layer 112 may be copper or another conductive material, such as gold, aluminum, silver, tungsten, palladium, or another metal, alloy or the like. The PPI layer 112 may be deposited using a vapor deposition method such as molecular beam epitaxy (MBE), chemical vapor deposition (CVD) or plasma enhanced CVD (PECVD), or by electroplating, atomic layer deposition (ALD), or the like. Forming the PPI layer 112 may also comprise forming an initial barrier layer, seed layer or the like, and forming the PPI layer 112 over the initial layer. In such an embodiment, the seed layer may be formed, then a mask applied, and the PPI layer 112 deposited via electroplating. The mask and any excess seed layer may be subsequently removed.

FIG. 1E shows an interconnect 114 formed over the PPI layer 112, e.g. over the extension portion 112b of the PPI layer 112. The interconnect 114 may comprise a conductive material such as gold, copper, aluminum, lead (Pb), silver, tungsten, tin (Sn), a solder paste, a conductive epoxy or polymer, combinations thereof, or the like. The interconnect 114 may be formed over the PPI layer 112 by deposition, evaporation, electroplating, printing, solder transfer, a combination thereof, or the like. In some embodiments, the interconnect 114 may be a solder bump.

FIG. 1F shows the formation of dam members 116 over the second insulating layer 110. The dam members 116 may be laterally separated from the PPI layer 112. In an embodiment where the substrate 102 is a wafer, the dam members 116 may be a part of a ring that may be formed along an edge of the substrate 102. As an example, FIG. 2 shows a top-down view of a dam ring 216 formed along an edge of the substrate 102. The dam members 116 shown in FIG. 1F may, as an example, be a cross-sectional view of the dam ring 216 taken along a line A-A' shown in FIG. 2. The dam members 116 may comprise a polyimide, polybenzoxazole (PBO), benzocyclobutene (BCB), silicones, acrylates, polymers, epoxy, and the like, although other relatively soft, often organic, dielectric materials can also be used. As an example, the dam members 116 may comprise a material having a coefficient of thermal expansion (CTE) in the range from about 10 ppm/K to about 250 ppm/K, a Young's Modulus in the range from about 0.05 GPa to 4.5 GPa, and a glass transition temperature (Tg) in the range from about −10 degrees Celsius to about 450 degrees Celsius. In some embodiments, the dam members 116 may have a dimension D1 (e.g. a height) which may be in a range from about 30 micrometers to about 80 micrometers (e.g. about 50 micrometers).

The dam members 116 may be formed by photolithography in which a material for the dam members 116 is deposited over the second insulating layer 110 and the PPI layer 112, patterned, and then etched to form the dam members 116. In some embodiments, the dam members 116 may be formed by a printing method. Using the printing method, a stencil with openings may be overlaid on the second insulating layer 110 and the PPI layer 112. Subsequently, material for the dam members 116 may be dispensed over the stencil. In some embodiments, one or more blades or wipers may brush across the stencil back and forth to apply the material into the openings of the stencil. In some other embodiments, the dam members 116 may be formed by a taping method. In one embodiment, a tape having pre-formed dam members 116 may be applied to the second insulating layer 110 and the PPI layer 112. The tape may then be removed to leave behind the dam members 116.

FIG. 1G shows a third insulating layer 118 formed over the PPI layer 112. The third insulating layer 118 may comprise an oxide, a nitride, or a polymer such as a polyimide, a polybenzoxazole (PBO), benzocyclobutene (BCB), an epoxy, a liquid molding compound, a resin, a moldable polymer, or the like. As shown in FIG. 1G, the third insulating layer 118 may be formed by releasing molding compound material 120 using a dispenser 122. The molding compound material 120 may be released using a dispensing and/or printing process. In some embodiments, the dispenser 122 may be positioned near an edge region of the substrate 102, which may be a region of the substrate 102 in which the dam members 116 are formed. As molding compound material 120 for the third insulating layer 118 is dispensed and/or printed (e.g. using an ink-jet), the molding compound material 120 may flow across the PPI layer 112 and may at least laterally encapsulate the PPI layer 112. Portions of the interconnect 114 proximal the substrate 102 may also be surrounded by the third insulating layer 118. In some embodiments, the dam members 116 may function to prevent spillage of the third insulating layer 118 such that the molding compound material 120 of the third insulating layer 118 is contained within a lateral extent L1 of the substrate 102. The process flow may continue with a curing of the third insulating layer 118. The curing process may include a first stage of heating the third insulating layer 118 from about room temperature to a first temperature that may be greater than about 100 degrees Celsius (e.g. in a range from about 100 degrees Celsius to about 140 degrees Celsius). The first temperature may be held for a duration of at least about 20 minutes. Following this, a second stage of the curing process may include heating the third insulating layer 118 from the first temperature to a second temperature that may be in a range from about 150 degrees Celsius to about 400 degrees Celsius. The second temperature may subsequently be held for a duration of at least 20 minutes.

The third insulating layer 118 may comprise a material having a CTE greater than about 3 ppm/K, e.g. in the range from about 10 ppm/K to about 250 ppm/K. The third insulating layer 118 may comprise filler particles, such as silica filler, glass filler or similar fillers. A dimension of each of the filler particles (e.g. a width) may be less than about 5 micrometers. The filler particles may make up less than 10 percent by weight of the third insulating layer 118. As a result of the CTE of the third insulating layer 118, the size of the filler particles in the third insulating layer 118, and/or the proportion, by weight, of the filler particles in the third insulating layer 118, the molding compound material 120 may be dense and may have a high viscosity, thereby allowing for greater control of a thickness of the third insulating layer 118. Furthermore, as a result of the greater density of the third insulating layer 118 (e.g. compared to the first and second insulating layers 106, 110), the thickness of the third insulating layer 118 may be reduced while still the necessary mechanical protection to the underlying conductive and/or non-conductive layers. Even further, the greater control of a thickness of the third insulating layer 118 can, in turn, result in a substantially uniform thickness of the third insulating layer 118 along the lateral extent L1 of the substrate 102.

The process flow shown in FIGS. 1A to 1G utilizes a printing and/or dispensing process to form the third insulating layer 118. The printing and/or dispensing process is possible due, at least in part, to the greater density of the third insulating layer 118 (e.g. compared to the first and second insulating layers 106, 110). Furthermore, the printing and/or dispensing process can be implemented using simple steps and simple equipment, e.g. compared to other techniques for forming the third insulating layer 118 such as compression molding processes that may be followed by a plasma clean process. This can lead to significant cost reductions. For example, the printing and/or dispensing process may be accomplished by an inkjet printer, which is cheaper than a molding tool that may be used in a compression molding process. Furthermore, using a printing and/or dispensing process to form the third insulating layer 118 can lead to high manufacturing throughput, e.g. compared to other techniques for forming the third insulating layer 118 such as compression molding processes that may be followed by a plasma clean process. Even further, as shown in FIGS. 1A to 1G, no etch process is performed in connection with the formation of the third insulating layer 118. As such, substantially no residue material (e.g. organic and/or inorganic residue material) is formed on exposed surfaces of the interconnect 114, which can lead to greater reliability of devices that may be manufactured using the process flow shown in FIGS. 1A to 1G.

Figure 3:
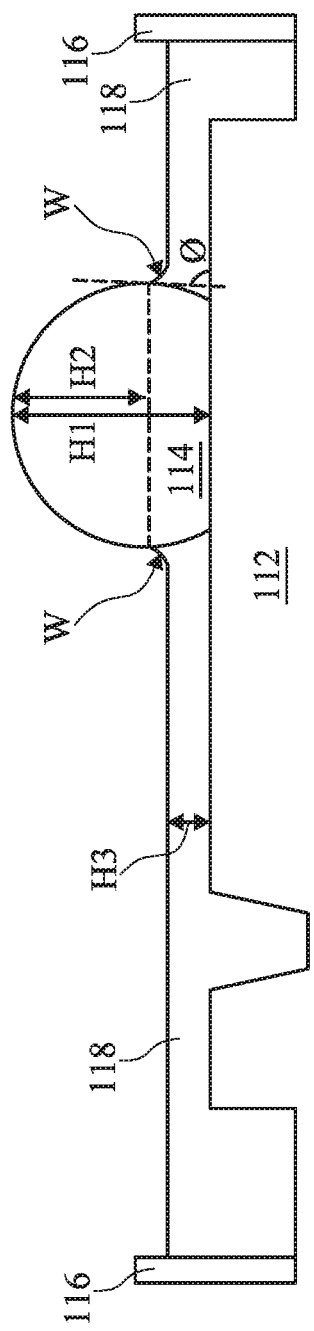
FIG. 3 shows an enlarged view of the interconnect shown in FIG. 1G, in accordance with some embodiments.

FIG. 3 shows an enlarged view of the interconnect shown in FIG. 1G, in accordance with an embodiment. In essence, FIG. 3 shows the third insulating layer 118 overlying the PPI layer 112 and covering a lower portion of the interconnect 114. A top surface of the third insulating layer 118 has a concave surface region and a planar surface region, the concave surface region being positioned between the solder bump and the planar surface region as shown in FIG. 3, the concave surface region extends outwards from the interconnect 114.

As shown in FIG. 3, the third insulating layer 118 may laterally surround a portion the interconnect 114 (e.g. the lower portion of the interconnect 114). The third insulating layer 118 may physically contact the interconnect 114 at a waist W of the interconnect 114. As shown in FIG. 3, the third insulating layer 118 may have a curved surface around the interconnect 114, e.g. as a result of the third insulating layer 118 climbing to the waist W of the interconnect 114. As an example, the third insulating layer 118 may have a concave surface extending outwards from the interconnect 114. Due to the high density and viscosity of the third insulating layer 118, the curved surface of the third insulating layer 118 shows a steep drop off since the third insulating layer 118 does not climb over a substantial portion of the interconnect 114. As an example, an angle φ subtended between an axis parallel to the first surface 102a of the substrate 102 and a tangent to the waist W of the third insulating layer 118 may less than about 100 degrees. FIG. 3 also shows the interconnect 114 having a total height H1, of which height H2 is exposed. In an embodiment, the height H2 may be at least 30 percent (e.g. greater than about 50 percent) of the total height H1 of the interconnect 114 since the third insulating layer 118 does not climb over a substantial portion of the interconnect 114. As a result, a stand-off height of the interconnect 114 is increases, e.g. compared to other techniques for forming the third insulating layer 118 such as compression molding processes that may be followed by a plasma clean process. In some embodiments, a thickness H3 of the third insulating layer 118 over the PPI layer 112 may be in a range from about 0.1 micrometers to about 10 micrometers, while the total height H1 of the interconnect 114 may be in a range from about 100 micrometers to about 250 micrometers.

Figure 4:
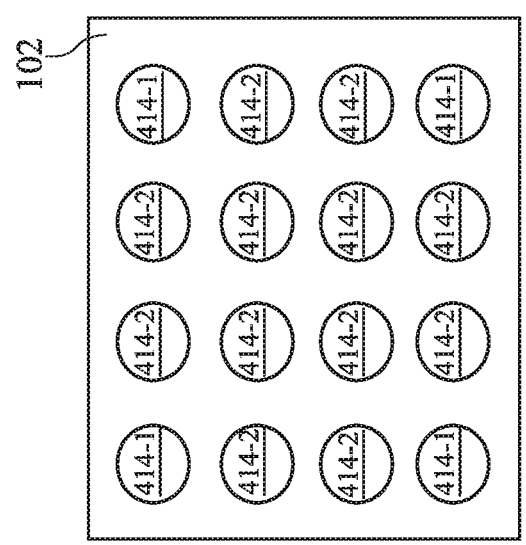
FIG. 4 shows a top-down view of a plurality of interconnects formed over a substrate, in accordance with some embodiments.

FIG. 4 shows a top-down view of a plurality of interconnects 414-1, 414-2 formed over the substrate 102. The plurality of interconnects 414-1, 414-2 may be arranged as an array of interconnects, as shown in the example of FIG. 4. Other features such as the one or more contact pads 104, the first insulating layer 106, the second insulating layer 110, and the PPI layer 112 are not shown in FIG. 4 for the sake of simplicity. The plurality of interconnects 414-1, 414-2 may comprise corner interconnects 414-1 that may be disposed at corner regions of the substrate 102. The plurality of interconnects 414-1, 414-2 may also comprise central interconnects 414-2 that may be disposed in central regions of the substrate 102. As described above, the process flow shown in FIGS. 1A to 1G can result in an increased stand-off height of the interconnect 114. Similarly, the process flow shown in FIGS. 1A to 1G may be used to form the third insulating layer 118 around each of the plurality of interconnects 414-1, 414-2. However, in another embodiment, instead of forming the third insulating layer 118 around each of the plurality of interconnects 414-1, 414-2, the dispensing and/or printing process described above may be used to form the third insulating layer 118 around selected ones of the plurality of interconnects 414-1, 414-2. As an example, it may be desirable to decrease a thickness of the third insulating layer 118 at corners regions of the substrate 102 compared to central regions thereof in order to increase interconnect stand-off height at the corner regions of the substrate 102 so as to improve on-board reliability. As an example, it may be desirable that the third insulating layer 118 located at central regions of the substrate 102 (e.g. located around central interconnects 414-2) be at least about 5 micrometers thicker than the third insulating layer 118 located at corner regions of the substrate 102 (e.g. located around corner interconnects 414-1). This difference in thicknesses of the third insulating layer 118 at different regions of the substrate 102 may be accomplished by using the process flow shown in FIGS. 1A to 1G to selectively dispense and/or print the third insulating layer 118 around the corner interconnects 414-1 so as to prevent the third insulating layer 118 from climbing over a substantial portion of the corner interconnects 414-1. As described above, this may, in turn, increase interconnect stand-off height and improve on-board reliability. It should be noted, however, that the thicknesses of the insulating layer 118 between adjacent (e.g. immediately adjacent) central interconnects 414-2 may be substantially equal to the thickness of the insulating layer 118 between a central interconnect 414-2 and the edge of the substrate 102.

In accordance with an embodiment, a method of forming a wafer level chip scale package interconnect may include: forming a post-passivation interconnect (PPI) layer over a substrate; forming an interconnect over the PPI layer; and releasing a molding compound material over the substrate, the molding compound material flowing to laterally encapsulate a portion of the interconnect.

In accordance with an embodiment, a method of forming a wafer level chip scale package interconnect may include: forming a contact pad over a substrate; forming a first insulating layer over the substrate and over a periphery of the contact pad, the first insulating layer having an opening exposing a central region of the contact pad; forming a second insulating layer over the first insulating layer; forming a post-passivation interconnect (PPI) layer over the second insulating layer, the PPI having a portion disposed in the opening and contacting the contact pad; forming an interconnect over the PPI layer disposed over the second insulating layer; and forming a third insulating layer over the PPI layer using at least one of a printing or dispensing process, the third insulating layer laterally surrounding a portion of the interconnect proximal the substrate.

In accordance with an embodiment, a semiconductor package may include: a substrate; a contact pad overlying the substrate; at least one insulating layer disposed over the substrate and having an opening exposing a portion of the contact pad; a post-passivation interconnect (PPI) layer disposed within the opening and extending over a surface of the at least one insulating layer facing away from the substrate; an array of solder bumps overlying the PPI layer; and a molding compound layer overlying the PPI layer and covering a lower portion of each solder bump of the array of solder bumps, wherein a thickness of the molding compound surrounding a first solder bump located in a corner region of the substrate is less than a thickness of the molding compound surrounding a second solder bump located in a central region of the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a post-passivation interconnect (PPI) layer over a substrate;
    forming an interconnect over the PPI layer;
    forming dam members over the substrate, the dam members forming a ring surrounding the PPI layer; and
    releasing a molding compound material over the substrate, the molding compound material flowing to laterally encapsulate a portion of the interconnect at a waist, the molding compound material having a greater thickness at a central region within the ring than at a location proximate the ring, an angle subtended between a tangent to the waist of the interconnect and an axis parallel to a major surface of the substrate being less than about 100 degrees.

2. The method of claim 1, wherein the releasing the molding compound material comprises at least one of a dispensing or a printing process.

3. The method of claim 1, wherein the forming the PPI layer comprises at least one of molecular beam epitaxy, chemical vapor deposition, plasma enhanced chemical vapor deposition, electroplating, or atomic layer deposition.

4. The method of claim 1, further comprising curing the molding compound material.

5. The method of claim 1, wherein the molding compound material comprises at least one of a polybenzoxazole (PBO), benzocyclobutene (BCB), an epoxy, a liquid molding compound, a resin, or a moldable polymer.

6. The method of claim 1, wherein the molding compound material comprises filler particles.

7. The method of claim 6, wherein a dimension of the filler particles is less than about 5 micrometers.

8. The method of claim 6, wherein the filler particles make up less than about 10 percent by weight of the molding compound material.

9. The method of claim 1, wherein less than 50 percent of the interconnect is laterally encapsulated by the molding compound material.

10. A method, comprising:
    forming a contact pad over a substrate;
    forming a first insulating layer over the substrate and over a periphery of the contact pad, the first insulating layer having an opening exposing a central region of the contact pad;
    forming a second insulating layer over the first insulating layer;
    forming a post-passivation interconnect (PPI) layer over the second insulating layer, the PPI having a portion disposed in the opening and contacting the contact pad;
    forming an interconnect over the PPI layer disposed over the second insulating layer; and
    forming a third insulating layer over the PPI layer using at least one of a printing or dispensing process, the third insulating layer laterally surrounding a portion of the interconnect proximal the substrate, the third insulating layer contacting the portion at a waist of the interconnect, an angle subtended between a tangent to the waist of the interconnect and an axis parallel to a major surface of the substrate is less than about 100 degrees.

11. The method of claim 10, further comprising:
    prior to forming the third insulating layer, forming dam members laterally separated from the PPI layer.

12. The method of claim 11, wherein the forming the dam members comprises at least one of photolithography, taping, or printing.

13. The method of claim 10, wherein the forming the interconnect over the PPI layer comprises at least one of deposition, evaporation, electroplating, printing, or solder transfer.

14. The method of claim 10, wherein a thickness of the third insulating layer over the PPI layer is in a range from about 0.1 micrometers to about 10 micrometers.

15. A semiconductor package, comprising:
    a substrate;
    a contact pad overlying the substrate;
    at least one insulating layer disposed over the substrate and having an opening exposing a portion of the contact pad;
    a post-passivation interconnect (PPI) layer disposed within the opening and extending over a surface of the at least one insulating layer facing away from the substrate;

a first solder bump and a second solder bump overlying the PPI layer; and a molding compound layer overlying the PPI layer and covering a lower portion of each of the first solder bump and the second solder bump, wherein a thickness of the molding compound layer surrounding the first solder bump located in a corner region of the substrate is less than a thickness of the molding compound layer surrounding the second solder bump located in a central region of the substrate.

16. The semiconductor package of claim 15, wherein the thickness of the molding compound layer surrounding the second solder bump is at least about 5 micrometers greater than the thickness of the molding compound layer surrounding the first solder bump.

17. The semiconductor package of claim 15, wherein a thickness of the molding compound layer between the second solder bump and an edge of the substrate is substantially equal to a thickness of the molding compound layer between the second solder bump and a third solder bump located in the central region of the substrate.

18. The semiconductor package of claim 15, wherein less than 50 percent of the first solder bump is covered by the molding compound layer.

19. The semiconductor package of claim 15, wherein the molding compound layer has a coefficient of thermal expansion greater than about 3 ppm/K.

20. The method of claim 1, wherein the molding compound material contacts a waist of the interconnect, the waist being a portion of the interconnect proximate to the substrate, a tangent line at the waist of the interconnect forming an angle of less than 100 degrees with an axis parallel to a major surface of the substrate.

* * * * *